(12) United States Patent
Son et al.

(10) Patent No.: US 12,116,660 B2
(45) Date of Patent: Oct. 15, 2024

(54) MASK, MASK FABRICATION METHOD, AND MASK ASSEMBLY

(71) Applicant: Samsung Display Co., Ltd., Yongin-si (KR)

(72) Inventors: Ji-Hee Son, Hwaseong-si (KR); Minho Moon, Seongnam-si (KR); Youngmin Moon, Yongin-si (KR); Seungyong Song, Suwon-si (KR); Seul Lee, Hwaseong-si (KR); Sungsoon Im, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 469 days.

(21) Appl. No.: 17/383,787

(22) Filed: Jul. 23, 2021

(65) Prior Publication Data

US 2022/0136093 A1     May 5, 2022

(30) Foreign Application Priority Data

Nov. 3, 2020 (KR) .......................... 10-2020-0145382

(51) Int. Cl.
| | | |
|---|---|---|
| *C23C 14/04* | (2006.01) | |
| *C23C 16/34* | (2006.01) | |
| *C23C 16/40* | (2006.01) | |
| *C23C 16/56* | (2006.01) | |
| *G03F 7/00* | (2006.01) | |
| *G03F 7/16* | (2006.01) | |
| *C23C 14/24* | (2006.01) | |
| *C23C 14/34* | (2006.01) | |
| *H10K 59/12* | (2023.01) | |
| *H10K 71/16* | (2023.01) | |

(52) U.S. Cl.
CPC .......... *C23C 14/042* (2013.01); *C23C 16/345* (2013.01); *C23C 16/401* (2013.01); *C23C 16/56* (2013.01); *G03F 7/0015* (2013.01); *G03F 7/167* (2013.01); *C23C 14/24* (2013.01); *C23C 14/34* (2013.01); *H10K 59/12* (2023.02); *H10K 71/166* (2023.02)

(58) Field of Classification Search
None
See application file for complete search history.

(56) References Cited

U.S. PATENT DOCUMENTS

| | | | |
|---|---|---|---|
| 9,555,433 | B2 | 1/2017 | Sugimoto et al. |
| 2021/0265602 | A1* | 8/2021 | Sakio .................... C23C 14/042 |

FOREIGN PATENT DOCUMENTS

| | | | |
|---|---|---|---|
| JP | 4126648 | 7/2008 | |
| JP | 6588125 | 10/2019 | |
| KR | 10-2078888 | 2/2020 | |
| WO | WO2020031302 | * 2/2020 | ............. C23C 14/04 |

* cited by examiner

*Primary Examiner* — Jiong-Ping Lu
(74) *Attorney, Agent, or Firm* — KILE PARK REED & HOUTTEMAN PLLC

(57) ABSTRACT

A mask, a mask assembly, and a method of fabricating a mask are disclosed herein. The mask comprises a polymer film in which at least one cell region and at least one peripheral region are defined, the at least one peripheral region surrounding the at least one cell region, a conductive layer disposed on the polymer film and including a metal, an inorganic layer disposed between the polymer film and the conductive layer and including a silicon-based inorganic material, and holes that penetrate the polymer film, the conductive layer, and the inorganic layer and overlap the at least one cell region in a plan view.

15 Claims, 16 Drawing Sheets

MASK, MASK FABRICATION METHOD, AND MASK ASSEMBLY

CROSS-REFERENCE TO RELATED APPLICATION(S)

This application claims priority to and benefits of Korean Patent Application No. 10-2020-0145382 under 35 U.S.C § 119, filed on Nov. 3, 2020 in the Korean Intellectual Property Office, the entire contents of which are incorporated herein by reference.

BACKGROUND

1. Technical Field

The invention relates to a mask with improved reliability, a method of fabricating the mask, and a mask assembly including the mask.

2. Description of the Related Art

A display panel includes pixels. Each of the pixels includes a driving element such as a transistor and a display element such as organic light emitting diode. The display element may be formed by disposing an electrode and a light emission pattern on a substrate.

The light emission pattern is formed on a specific region using a mask in which holes are defined. The light emission pattern may be formed on a region exposed by the holes. Because repetitive use of a production facility is required for mass production of display panels, research may be needed to provide the production facility with increased reliability.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment provides a mask with increased reliability and a mask assembly including the same. An embodiment provides a mask fabrication method by which a mask with increased reliability is manufactured without additional investment of facility.

According to an embodiment, a mask may comprise a polymer film in which at least one cell region and at least one peripheral region are defined, the at least one peripheral region surrounding the at least one cell region, a conductive layer disposed on a surface of the polymer film, the conductive layer including a metal; an inorganic layer disposed between the polymer film and the conductive layer, the inorganic layer including a silicon-based inorganic material, and holes that penetrate the polymer film, the conductive layer, and the inorganic layer, and overlap the at least one cell region in a plan view.

In an embodiment, the inorganic layer may include at least one of silicon oxide ($SiO_x$) and silicon nitride ($SiN_x$).

In an embodiment, the polymer film may include at least one of polyimide (PI), polycarbonate (PC), polyethylene naphthalene (PEN), and polyethylene terephthalate (PET).

In an embodiment, the conductive layer may include at least one of nickel (Ni), gold (Au), titanium (Ti), molybdenum (Mo), titanium nitride ($TiN_x$), indium tin oxide (ITO), and indium zinc oxide (IZO).

In an embodiment, a thickness of the polymer film may be in a range of about 3 μm to about 50 μm.

In an embodiment, a thickness of the inorganic layer may be less than a thickness of the polymer film.

In an embodiment, the at least one cell region may include multiple cell regions. The plurality of multiple cell regions may be spaced apart from each other, and the at least one peripheral region may be disposed between adjacent ones of the multiple cell regions.

According to an embodiment, a mask assembly may comprise a mask frame in which at least one opening is defined, and at least one mask disposed on the mask frame corresponding to the at least one opening of the mask frame. The at least one mask may include a polymer film in which at least one cell region and at least one peripheral region are defined, the at least one peripheral region surrounding the cell region, a conductive layer disposed on a surface of the polymer film, the conductive layer including a metal, and an inorganic layer disposed between the polymer film and the conductive layer, the inorganic layer including a silicon-based inorganic material, and holes that penetrate the polymer film, the conductive layer, and the inorganic layer, and overlap the at least one cell region in a plan view.

In an embodiment, the inorganic layer may include at least one of silicon oxide ($SiO_x$) and silicon nitride ($SiN_x$).

In an embodiment, the at least one cell region may include multiple cell regions, the multiple cell regions may be spaced apart from each other, the at least one peripheral region may be disposed between adjacent ones of the multiple cell regions, and the multiple cell regions may overlap the at least one opening in a plan view.

In an embodiment, the at least one opening may include multiple openings, the at least one mask may include multiple masks, and the multiple masks may be disposed on the mask frame corresponding to the multiple openings.

In an embodiment, a portion of the at least one mask may be bonded to the mask frame to overlap the at least one peripheral region in a plan view. The portion of the at least one mask bonded to the mask frame may include a metal oxide.

According to an embodiment, a mask fabrication method may comprise forming a preliminary polymer film, forming a preliminary inorganic layer on the preliminary polymer film, forming a preliminary conductive layer on the preliminary inorganic layer, and forming holes which penetrate the preliminary polymer film, the preliminary inorganic layer, and the preliminary conductive layer. The preliminary inorganic layer may include a silicon-based inorganic material, and the preliminary conductive layer may include a metal.

In an embodiment, the preliminary inorganic layer may be formed by chemical vapor deposition (CVD).

In an embodiment, the forming of the holes may include irradiating a laser to simultaneously penetrate the preliminary conductive layer, the preliminary inorganic layer, and the preliminary polymer film.

In an embodiment, a wavelength range of the laser may include a wavelength range of ultraviolet light.

In an embodiment, the forming of the holes may include irradiating the laser to form the holes to have a pattern in a plan view.

In an embodiment, the forming of the holes may include forming a patterned photoresist on the preliminary conductive layer, forming first preliminary holes which penetrate the preliminary conductive layer by a first etching step of etching the preliminary conductive layer, removing the photoresist, forming second preliminary holes which penetrate the preliminary inorganic layer and which overlap the first preliminary holes by a second etching step of etching the preliminary inorganic layer, and forming the holes which penetrate the preliminary polymer film and which overlap the second preliminary holes by a third etching step of etching the preliminary polymer film.

In an embodiment, the forming of the holes may include forming a patterned photoresist on the preliminary conductive layer, forming first preliminary holes which penetrate the preliminary conductive layer by a first etching step of etching the preliminary conductive layer, removing the photoresist, and forming the holes which penetrate the preliminary inorganic layer and the preliminary polymer film and which overlap the first preliminary holes by a second etching step of simultaneously etching the preliminary inorganic layer and the preliminary polymer film.

In an embodiment, the first etching step may include a wet etching step or a dry etching step. The second etching step and the third etching step may each include a dry etching step.

BRIEF DESCRIPTION OF THE DRAWINGS

The accompanying drawings are included to provide a further understanding of the embodiments and are incorporated in and constitute a part of this specification. The above and other aspects and features of the disclosure will become more apparent by describing in detail embodiments thereof with reference to the attached drawings, in which.

DETAILED DESCRIPTION OF THE EMBODIMENTS

Figure 1:
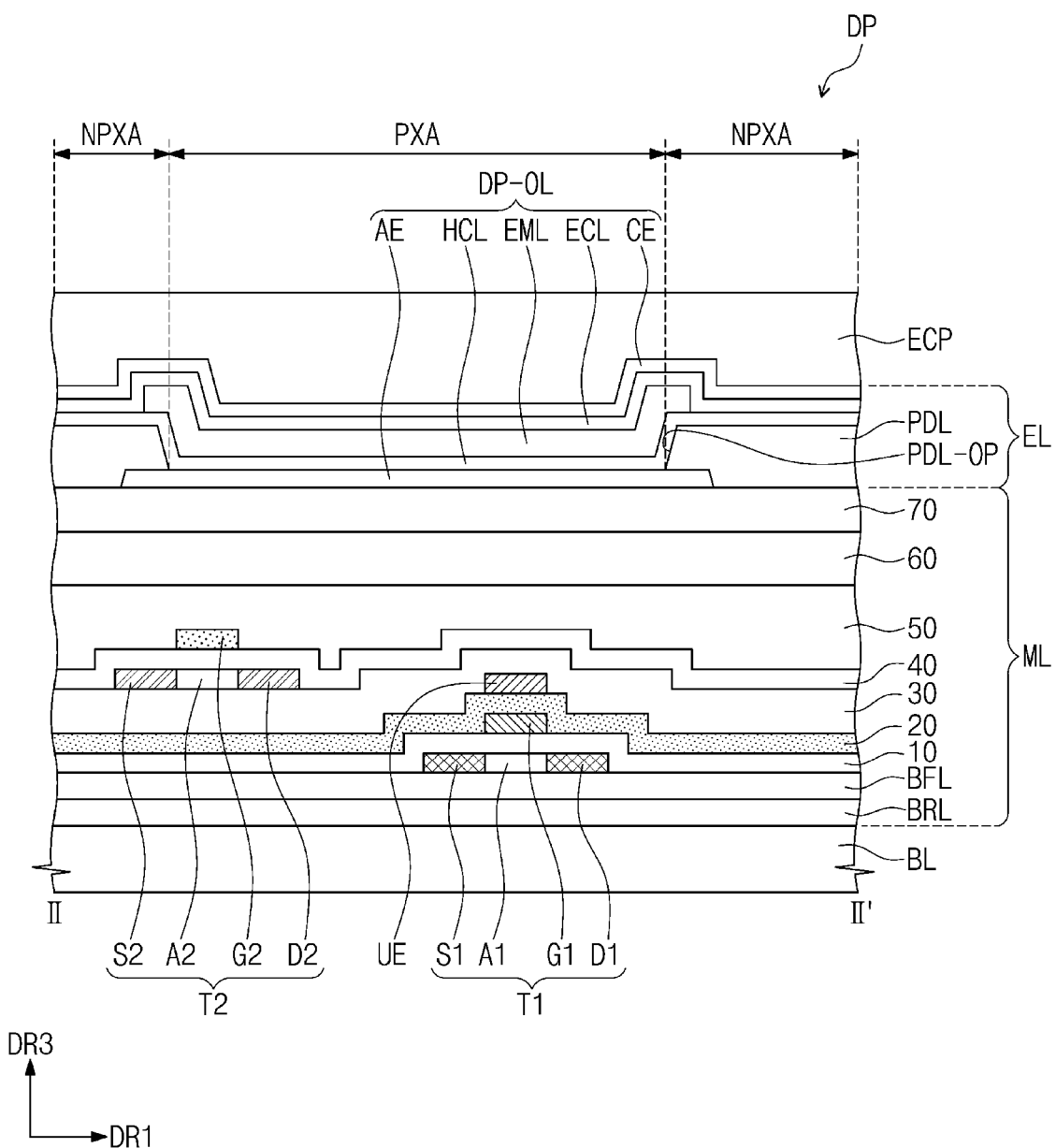
FIG. 1 illustrates a schematic cross-sectional view showing a display panel according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The following will now describe a mask, a mask assembly, and a mask fabrication method according to an embodiment.

FIG. 1 illustrates a schematic cross-sectional view showing a display panel according to an embodiment. In an embodiment, a display panel DP may be an organic light emitting display panel. FIG. 1 shows a schematic cross-section of one of the pixels. In this description, the pixel may include at least one transistor and at least one light emitting element. FIG. 1 shows a section of an embodiment where transistors T1 and T2 and a light emitting element DP-OL of the pixel are disposed.

A base layer BL may include a synthetic resin layer. The fabrication of the display panel DP may include forming the synthetic resin layer on a support substrate used for manufacturing the display panel DP, forming a conductive layer and an insulating layer on the synthetic resin layer, and removing the support substrate. When the support substrate is removed, the synthetic resin layer may correspond to the base layer BL.

A circuit element layer ML may include at least one insulating layer and at least one circuit element. The circuit element may include a signal line, a pixel driver circuit, and the like. The insulating layer, a semiconductor layer, and a conductive layer may be formed by coating and/or deposition processes, and the insulating layer, the semiconductor layer, and the conductive layer may be patterned by patterning processes, thereby forming the circuit element layer ML.

In an embodiment, the circuit element layer ML may include a barrier layer BRL, a buffer layer BFL, and first to seventh insulating layers 10, 20, 30, 40, 50, 60, and 70. The barrier layer BRL, the buffer layer BFL, and the first to seventh insulating layers 10 to 70 may include at least one of an inorganic layer and an organic layer. At least one of the fifth, sixth, and seventh insulating layers 50, 60, and 70 may include an organic layer.

The barrier layer BRL and the buffer layer BFL may be disposed on the base layer BL. At least one of the barrier layer BRL and the buffer layer BFL may include an inorganic layer. A semiconductor pattern may be disposed on the barrier layer BRL and the buffer layer BFL. The barrier layer BRL and the buffer layer BFL may increase an adhesive force between the base layer BL and the semiconductor pattern.

FIG. 1 shows an arrangement of an embodiment of a first active layer A1, a second active layer A2, a first gate electrode G1, a second gate electrode G2, a first source S1, a second source S2, a first drain D1, and a second drain D2 that constitute first and second transistors T1 and T2.

In an embodiment, the first active layer A1 and the second active layer A2 may include a different material from each other. The first active layer A1 may include a polysilicon semiconductor, and the second active layer A2 may include a metal oxide semiconductor. The first source S1 and the first drain D1 may each have a doping concentration greater than that of the first active layer A1, and may each serve as an electrode. The second source S2 and the second drain D2 may each be a reduced form of the metal oxide semiconductor and may each serve as an electrode.

In an embodiment, the first active layer A1 and the second active layer A2 may include a same semiconductor material, and the circuit element layer ML may have a simplified stack structure.

The first gate electrode G1 and the second gate electrode G2 may respectively overlap the first active layer A1 and the second active layer A2. The first gate electrode G1 and the second gate electrode G2 may each include a multilayered metal layer. The first gate electrode G1 and the second gate electrode G2 may each serve as a mask in a process in which the semiconductor pattern is doped.

An upper electrode UE may be disposed on the second insulating layer 20 which covers the first gate electrode G1. The upper electrode UE may overlap the first gate electrode G1. The upper electrode UE may include a multilayered metal layer. In an embodiment, the upper electrode UE may be omitted.

A display element layer EL may include a pixel definition layer PDL and a light emitting element DP-OL. The light emitting element DP-OL may be an organic light emitting diode or a quantum-dot light emitting diode. The light emitting element DP-OL may include a first electrode AE, a hole control layer HCL, a light emitting layer EML, an electron control layer ECL, and a second electrode CE, which are sequentially stacked.

The first electrode AE may be disposed on the seventh insulating layer 70. The pixel definition layer PDL may have an opening PDL-OP which exposes at least a portion of the first electrode AE. The opening PDL-OP of the pixel definition layer PDL may define a light-emitting region PXA. A non-light-emitting region NPXA may surround the light-emitting region PXA.

The hole control layer HCL and the electron control layer ECL may be disposed in common on the light-emitting region PXA and the non-light-emitting region NPXA. An open mask may be used such that the hole control layer HCL and the electron control layer ECL are formed in common on pixels.

The light emitting layer EML may be deposited in a different manner from the manner in which the hole control layer HCL and the electron control layer ECL are deposited, and each of the hole control layer HCL and the electron control layer ECL may be shaped like a thin film The light emitting layer EML may be formed differently in accordance with the type of pixel to be formed. A mask according to an embodiment may be used such that the light emitting layer EML is patterned to have a shape which corresponds to that of the opening PDL-OP of the pixel definition layer PDL.

However, embodiments are not limited thereto, and in a manner similar to the formation of the light emitting layer EML, a mask according to an embodiment may be used such that the hole control layer HCL and the electron control layer ECL are each patterned to have a shape which corresponds to that of the opening PDL-OP of the pixel definition layer PDL.

The second electrode CE may be disposed on the electron control layer ECL. An upper insulating layer ECP may be disposed on the second electrode CE. The upper insulating layer ECP may have multilayer structure including at least one of an inorganic layer and an organic layer. The upper insulating layer ECP may include insulating layers which encapsulate the display element layer EL and/or increase light emission efficiency.

Figure 2:
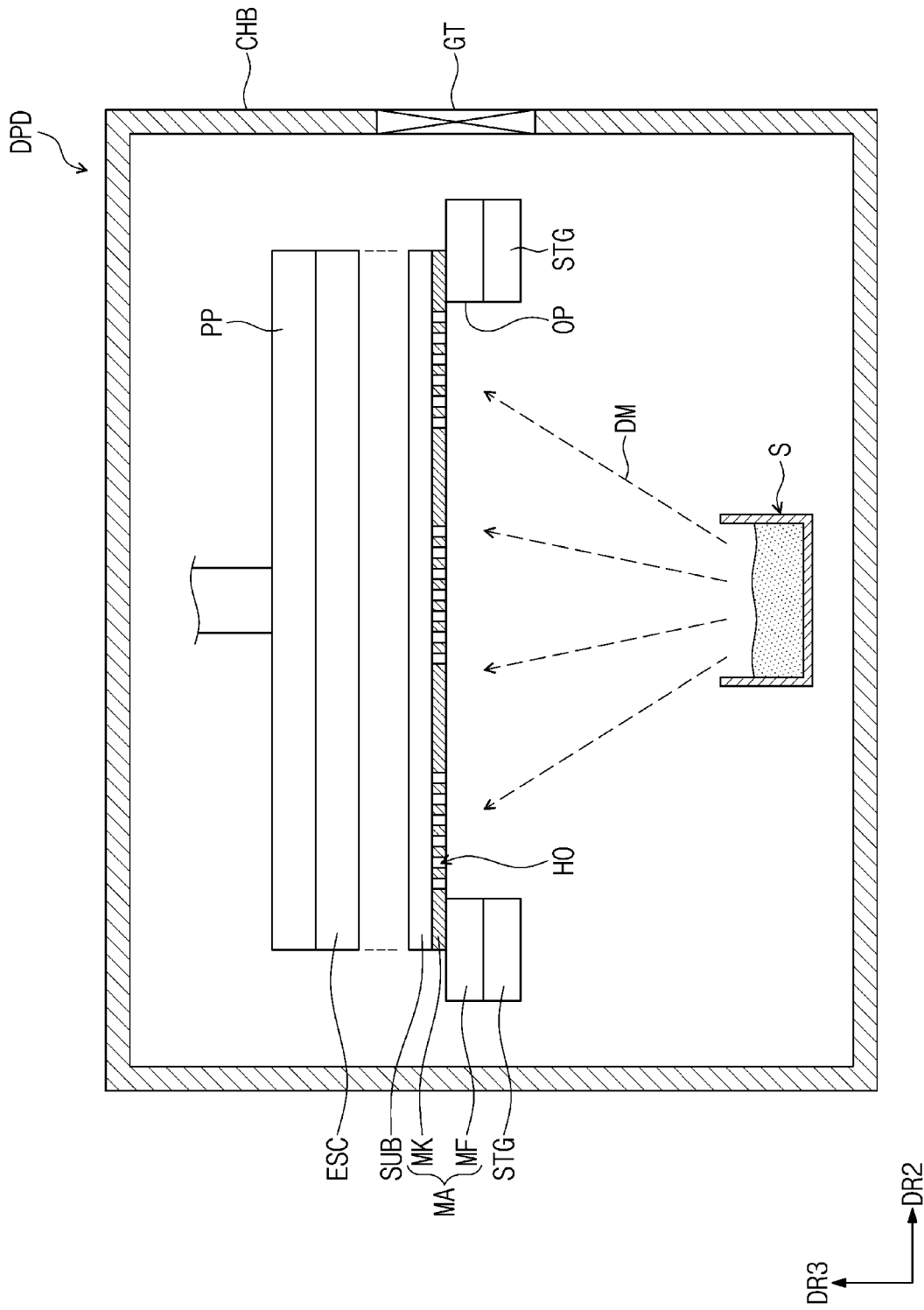
FIG. 2 illustrates a schematic cross-sectional view showing a deposition apparatus according to an embodiment.

FIG. 2 illustrates a schematic cross-sectional view showing a deposition apparatus according to an embodiment. A deposition apparatus DPD according to an embodiment may be employed for a deposition process in the manufacture of the display panel DP, such as for the light emitting layer EML, illustrated in FIG. 1. The deposition apparatus DPD may include a chamber CHB, and may include a deposition source S, a stage STG, a moving plate PP, and a mask assembly MA which are disposed in the chamber CHB. The mask assembly MA may include a mask frame MF and a mask MK.

The chamber CHB may provide a hermetic space and may establish a vacuum deposition condition. The chamber CHB may have a floor surface, a ceiling surface, and sidewalls. The floor surface of the chamber CHB is parallel to a plane defined by a first directional axis DR1 and a second directional axis DR2. A normal direction to the floor surface of the chamber CHB is parallel to a third directional axis DR3. In this description below, the first, second, and third directional axes DR1, DR2, and DR3 are defined to refer to first, second, and third directions, respectively, which first to third directions are allocated the same reference symbols.

The chamber CHB may have at least one gate GT. The chamber CHB may be opened or closed by the gate GT. A target substrate SUB may be loaded or unloaded into the chamber CHB through the gate GT of the chamber CHB.

The deposition source S includes a deposition material. The deposition material may include at least one of a metal, an inorganic material, and an organic material which are capable of being sublimated or evaporated. A deposition vapor DM evaporated from the deposition source S may pass through the mask MK and may be deposited on the target substrate SUB. The deposition source S according to an embodiment may include a light emitting material for manufacturing the light emitting element DP-OL. The light emitting material having the form of the deposition vapor DM evaporated from the deposition source S may be deposited on the target substrate SUB.

The stage STG may be disposed on the deposition source S. The stage STG may support the mask assembly MA placed on the stage STG. The stage STG may overlap the mask frame MF of the mask assembly MA, and may not overlap an opening OP of the mask frame MF. For example, the stage STG may be disposed outside a pathway of the deposition vapor DM supplied to the target substrate SUB.

The mask assembly MA of an embodiment may be disposed above the deposition source S in the chamber CHB. The target substrate SUB may be disposed on the mask assembly MA. The deposition vapor DM evaporated from the deposition source S may be deposited in a certain pattern on the target substrate SUB after passing through holes HO defined in the mask MK. The mask MK and the mask frame MF will be further discussed in detail below.

The moving plate PP may align the target substrate SUB onto the mask assembly MA. The moving plate PP may align the target substrate SUB by moving up, down, left, and/or right.

The moving plate PP may be provided thereon with a static-electricity inducing object, such as an electrostatic chuck ESC. The electrostatic chuck ESC may include a body part formed of ceramic and an electrode embedded in the body part. When a voltage is applied to the electrode of the electrostatic chuck ESC, an electrostatic force may be induced by the electrostatic chuck ESC. The electrostatic chuck ESC, from which an electrostatic force is induced, may apply an attractive force caused by the electrostatic force to a conductive layer (see CL of FIG. 3B) included in the mask MK. The target substrate SUB may be fixed on the mask assembly MA by the electrostatic force induced by the electrostatic chuck ESC, and that the target substrate SUB may be securely attached to the mask MK. Therefore, the mask MK may be prevented from sagging and a deposition process may have increased precision.

The target substrate SUB on which the deposition material is deposited using the deposition apparatus DPD may be separated from the mask assembly MA. After a deposition process, the target substrate SUB may have light emission pattern layers on a surface thereof. The light emission pattern layers may be formed on sections which correspond to cell regions (see CA of FIG. 3A) of the mask MK.

A deposition process using the deposition apparatus DPD may form display panels DP on the target substrate SUB. The display panels DP may be separated and provided after being cut along a cutting line on the target substrate SUB. However, embodiments are not limited thereto, and based on a size of the display panel DP to be fabricated, a single target substrate SUB may be formed into a single display panel DP.

Figure 3A:
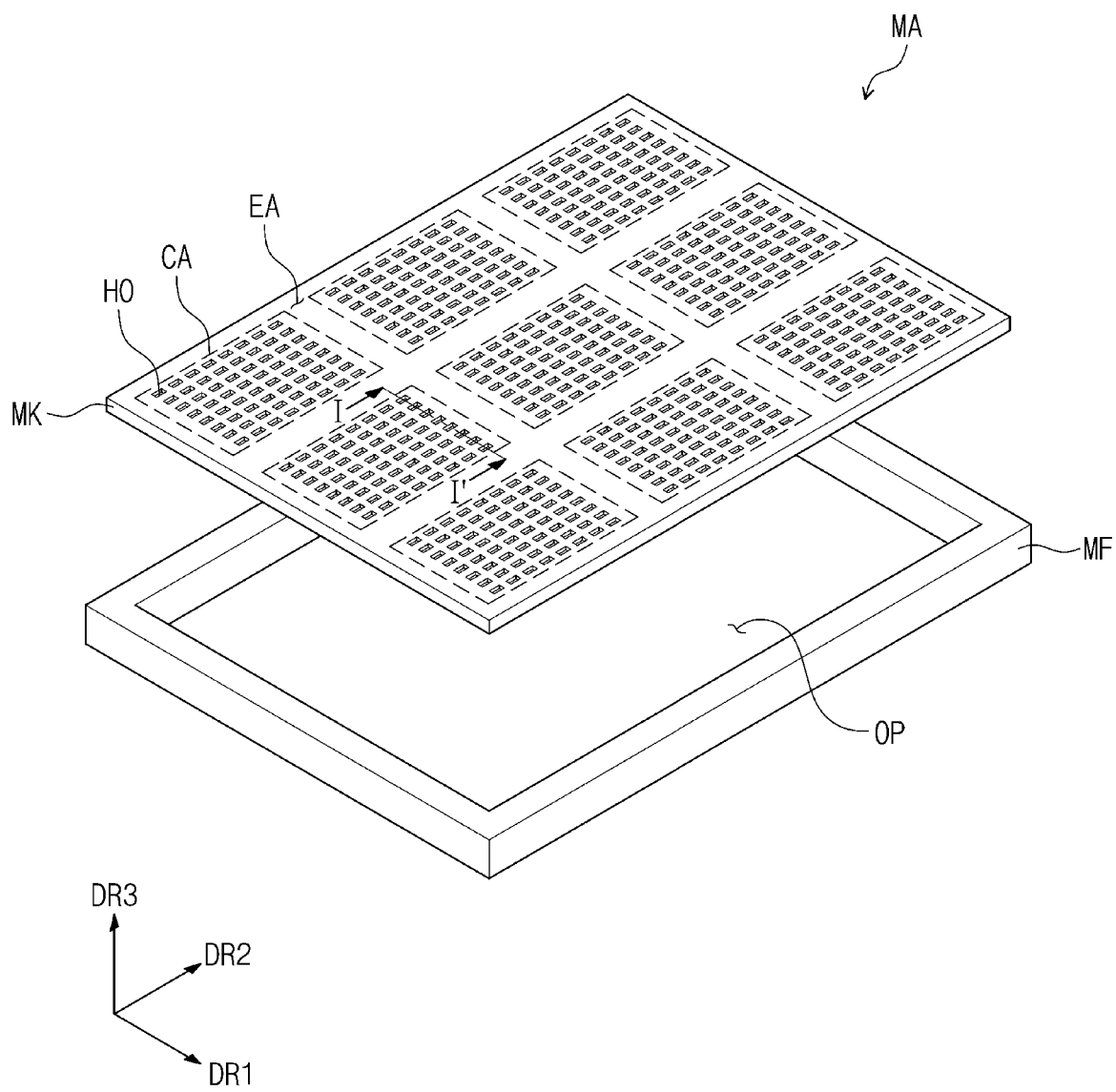
FIG. 3A illustrates a perspective view showing a mask assembly according to an embodiment.
Figure 3B:
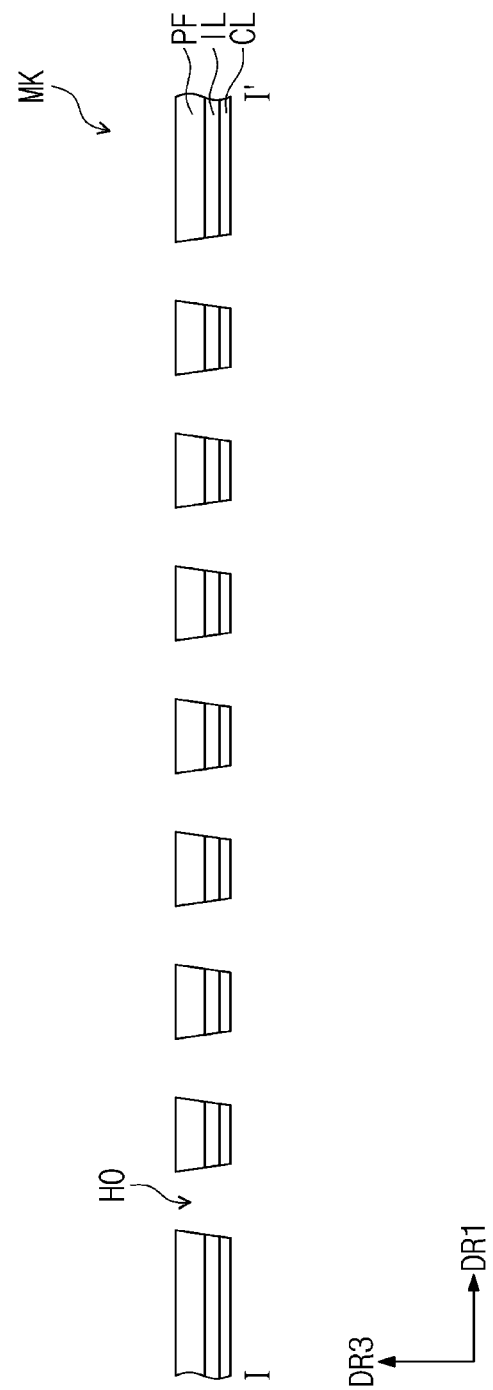
FIG. 3B illustrates a schematic cross-sectional view showing a mask taken along line I-I' of FIG. 3A.

FIG. 3A illustrates a perspective view showing a mask assembly according to an embodiment. FIG. 3B illustrates a schematic cross-sectional view of a mask taken along line I-I' of FIG. 3A. A mask assembly MA includes at least one mask MK and a mask frame MF.

In this description, a top surface (or front surface) and bottom surface (or rear surface) of each component is parallel to a plane defined by the first direction DR1 and the second direction DR2. The third direction DR3 indicates a thickness direction of each component. Upper and lower sides, or upper and lower portions, of each component are differentiated from each other in the third direction DR3. The first, second, and third directions DR1, DR2, and DR3 are relative concepts, and thus may be converted into other directions. In this description, the phrase "when viewed in plan (or in a plan view)" may mean "when viewed in the third direction DR3."

The mask frame MF may support the at least one mask MK. FIG. 3A illustrates an embodiment where the mask frame MF is disposed below and supports a lower portion of an edge of the at least one mask MK. However, embodiments are not limited thereto, and the mask frame MF may support the at least one mask MK while being disposed on upper and lower portions of the edge of the mask MK.

An opening OP may be defined in the mask frame MF. The mask frame MF may have at least one opening OP defined therein. The at least one opening OP may be a hole which penetrates from top to bottom surfaces of the mask frame MF. The at least one opening OP may expose a bottom surface of the at least one mask MK. In such a configuration, in the deposition apparatus (see DPD of FIG. 2), a deposition material may pass through the at least one mask MK after passing through the at least one opening OP of the mask frame MF.

The mask frame MF may have an annular shape (or ring shape) when viewed in a plan view. FIG. 3A shows an embodiment where the mask frame MF has a rectangular ring shape, but no limitation is imposed on the shape of the mask frame MF. For example, the mask frame MF may have a circular ring shape, a polygonal ring shape, or any other suitable shape.

The mask frame MF may include a metal. For example, the mask frame MF may include a stainless steel (SUS), an Invar alloy, nickel (Ni), or cobalt (Co), but no limitation is imposed on the material of the mask frame MF.

Figure 5A:
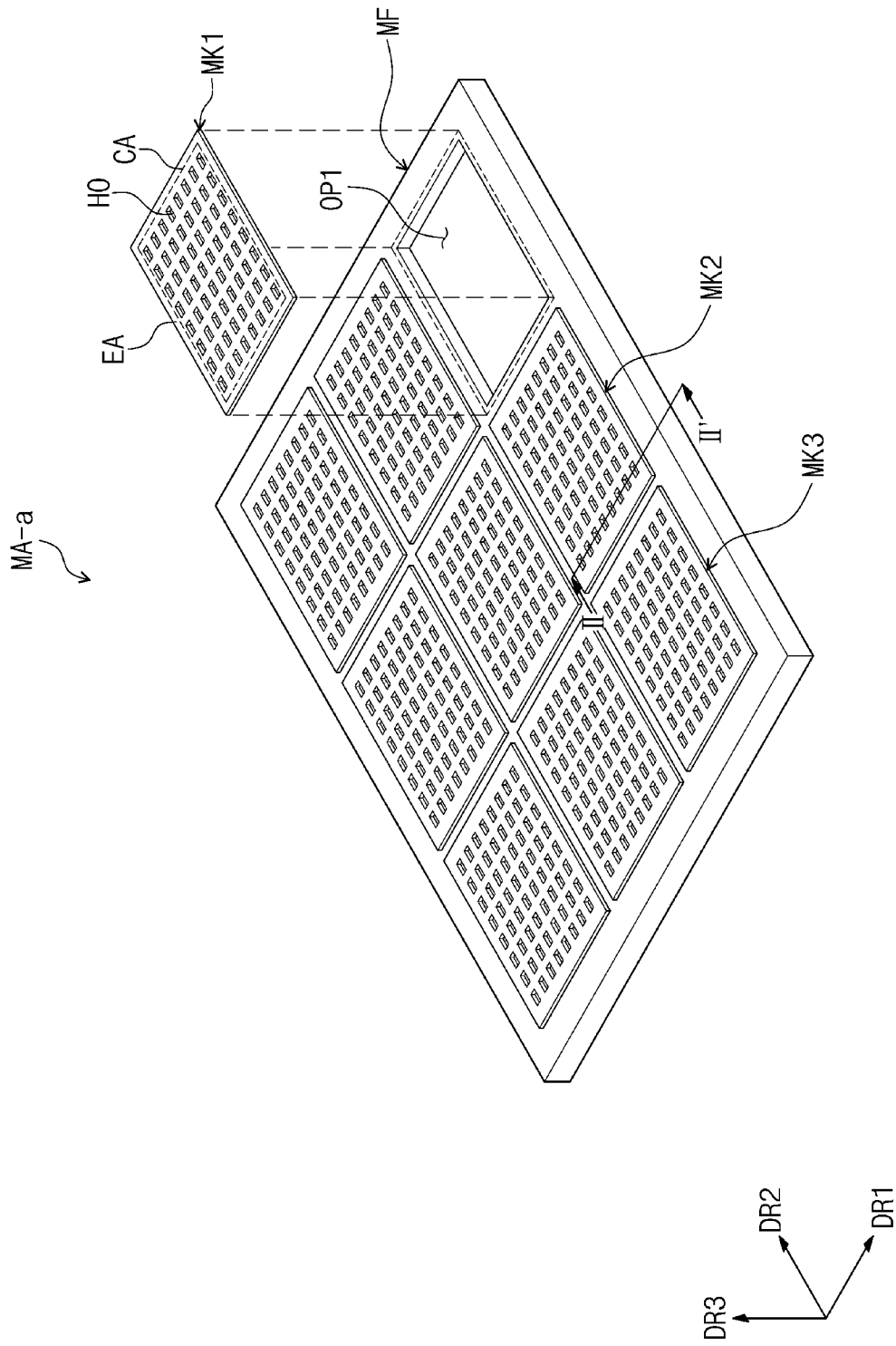
FIG. 5A illustrates a perspective view showing a mask assembly according to an embodiment.

The at least one mask MK may be disposed on the mask frame MF. The mask assembly MA of an embodiment may include a unitary single mask MK disposed on one mask frame MF. An embodiment, however, is not limited thereto, and multiple masks may be disposed on one mask frame MF as shown in FIG. 5A.

When viewed in a plan view, the mask MK according to an embodiment may have at least one cell region CA and at least one peripheral region EA which surrounds the at least one cell region CA. The mask MK may include holes HO which are defined in the at least one cell region CA and which penetrate therethrough along the third direction DR3, which is a thickness direction of the mask MK. The holes HO may be arranged to be spaced apart from each other in the at least one cell region CA. As an example, the holes HO are illustrated to be arranged along the first direction DR1 and the second direction DR2, but an embodiment is not limited thereto, and the holes HO may be defined to correspond to a shape of a light emitting layer of the display panel DP to be deposited.

The mask MK according to an embodiment may have a plate shape which extends along the first direction DR1 and the second direction DR2. In an embodiment, the at least one cell region CA may include multiple cell regions CA, in which multiple cell regions CA may be spaced apart from each other with the at least one peripheral region EA disposed between adjacent ones of the cell regions CA. For example, the at least one peripheral region EA may surround each of the cell regions CA and connect the cell regions CA to each other, and the mask MK may be shaped like a unitary single plate on which the cell regions CA are connected to each other.

The cell regions CA may be arranged along one or both of the first direction DR1 and the second direction DR2. As depicted in an embodiment shown in FIG. 3A, the cell regions CA may be arranged along the first and second directions DR1 and DR2 to have a matrix arrangement, but embodiments are not limited thereto, and the cell regions CA may be arranged along one of the first and second directions DR1 and DR2.

The cell regions CA may overlap the at least one opening OP of the mask frame MF. FIG. 3A shows nine cell regions CA which are spaced apart from each other in the first and second directions DR1 and DR2 and which overlap one opening OP. However, embodiments are not limited thereto, and more than nine or fewer than nine cell regions CA may be defined on the mask MK.

Referring to FIG. 3B, the mask MK may include a polymer film PF, an inorganic layer IL, and a conductive layer CL. The conductive layer CL may be disposed on a surface of the polymer film PF, and the inorganic layer IL may be disposed between the polymer film PF and the conductive layer CL.

The holes HO may penetrate in the third direction DR3 the conductive layer CL, the inorganic layer IL, and the polymer film PF which are sequentially stacked. The holes HO may be spaced apart from each other at a certain interval along one or both of the first and second directions DR1 and DR2.

The holes HO, which penetrate each of the conductive layer CL, the inorganic layer IL, and the polymer film PF, may each have a planar area, each of which may be changed based on location. For example, the holes HO may each have a planar area which decreases from the conductive layer CL to the polymer film PF.

The polymer film PF may be formed by coating or depositing a polymer resin. The polymer film PF may include at least one of polyimide (PI), polycarbonate (PC), polyethylene naphthalene (PEN), and polyethylene terephthalate (PET).

As the mask MK includes the polymer film PF, the mask MK may be formed to have a stick shape which extends in one direction or a plate shape which extends in both of the first and second directions DR1 and DR2. As the mask MK includes the polymer film PF, the mask MK may be easily formed to have a large size and a small weight. For example, it may be possible to fabricate a large-area mask which is suitable for forming multiple display panels at one time or forming a large-sized display panel. Therefore, when a display panel fabrication process uses the deposition apparatus (see DPD of FIG. 2) including the mask MK of an embodiment, the display panel fabrication process may decrease in process time and cost.

The polymer film PF may have a thickness in a range of about 3 μm to about 50 μm. When the polymer film PF has a thickness less than about 3 μm, the mask MK may have poor durability. When the polymer film PF has a thickness greater than about 50 μm, an overall thickness of the mask MK may decrease precision of a deposition process.

The conductive layer CL may include a metal or a metal oxide. The conductive layer CL may include a material which is not limited as long as the material can be coated or deposited and can produce an electrostatic force when coupled with the electrostatic chuck (see ESC of FIG. 2). For example, the conductive layer CL may include at least one of nickel (Ni), gold (Au), titanium (Ti), molybdenum (Mo), titanium nitride ($TiN_x$), indium tin oxide (ITO), and indium zinc oxide (IZO).

Referring to FIGS. 2 and 3B, the electrostatic force produced between the conductive layer CL and the electrostatic chuck ESC disposed in the deposition apparatus DPD may cause the target substrate SUB to contact the mask MK and may prevent the mask MK from sagging. As the mask MK is prevented from sagging, it may be possible to inhibit the occurrence of a shadow caused by the mask MK and to achieve a precise deposition process.

The conductive layer CL may have a thickness less than a thickness of the polymer film PF. For example, the conductive layer CL may have a thickness of about 3 nm to about 5 μm. When the conductive layer CL has a too small of a thickness, the mask MK may receive an insufficient electrostatic force induced by a static-electricity inducing object such as the electrostatic chuck ESC, and thus the mask MK may fail to closely attach to the target substrate SUB. When the conductive layer CL has a too large of a thickness, an overall thickness of the mask MK may decrease precision of a deposition process.

The inorganic layer IL may be disposed between and may adhere together the polymer film PF and the conductive layer CL. Each of an adhesive force between the inorganic layer IL and the polymer film PF and an adhesive force between the inorganic layer IL and the conductive layer CL may be greater than an adhesive force between the polymer film PF and the conductive layer CL. Therefore, compared to a conductive layer of a mask disposed on a polymer film, the conductive layer CL of the mask MK disposed on the inorganic layer IL of the mask MK of an embodiment may be difficult to peel off.

The inorganic layer IL may include an inorganic material having an adhesive force to each of the polymer film PF and the conductive layer CL that are greater than an adhesive force between the polymer film PF and the conductive layer CL. In an embodiment, the inorganic layer IL may include a silicon-based inorganic material. The silicon-based inorganic material may include any material as long as the material is capable of being formed by chemical vapor deposition. For example, the inorganic layer IL may include at least one of silicon oxide ($SiO_x$) and silicon oxynitride ($SiN_x$).

The inorganic layer IL may have a thickness less than that of the polymer film PF. When the inorganic layer IL has a too small of a thickness, the polymer film PF and the conductive layer CL may have a low adhesive force therebetween. When the inorganic layer IL has a too large of a thickness, an overall thickness of the mask MK may decrease precision of a deposition process.

The mask MK according to an embodiment may need an ultrasonic cleaning or a repetitive cleaning which removes contamination such as post-deposition materials after the mask MK is fabricated or after the mask MK has been used for a deposition process. When the mask MK does not include the inorganic layer IL, the ultrasonic cleaning or repetitive cleaning may peel the conductive layer CL off from the polymer film PF. In contrast, according to an embodiment, as the mask MK includes the inorganic layer IL, it may be possible to avoid the delamination of the conductive layer CL after the ultrasonic cleaning or repetitive cleaning. Therefore, the mask MK may become free of contamination and may be repeatedly used in a deposition process. Accordingly, the mask MK may have increased lifespan and reliability and may decrease a production cost and a material quantity of the mask MK required for a deposition process.

Figure 4:
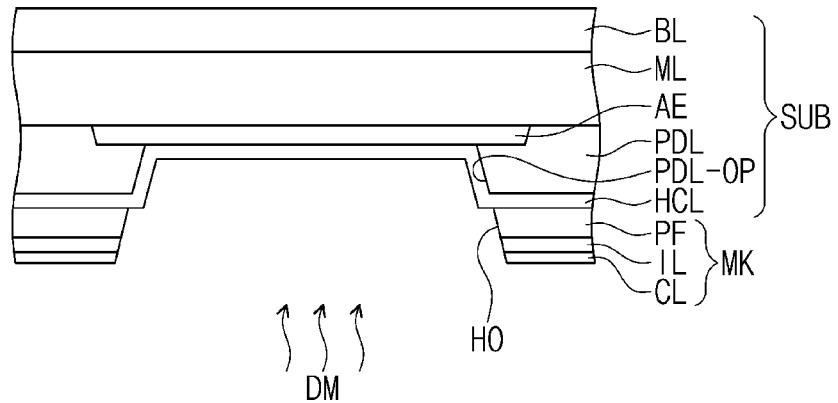
FIG. 4 illustrates a schematic cross-sectional view showing a step of a display panel fabrication procedure according to an embodiment.

FIG. 4 shows an enlarged schematic cross-sectional view showing a step in which the light emitting element of the display panel is formed by placing the target substrate (see SUB of FIG. 2) on the mask assembly MA shown in FIG. 3A according to an embodiment. A description on each component of the mask MK may be the same as that discussed with reference to FIGS. 3A and 3B. The target substrate SUB may correspond to a portion of the display panel (see DP of FIG. 1) before the light emitting layer (see EML of FIG. 1) is deposited.

A deposition process may be performed on the target substrate SUB in contact with the mask MK. A configuration in contact with the mask MK may be changed depending on a stacking structure of the display panel which will be fabricated. For example, at the step of forming the light emitting layer (see EML of FIG. 1) of the display panel, the polymer film PF of the mask MK may contact the hole control layer HCL disposed on the pixel definition layer PDL.

Holes HO may be defined in the mask MK. FIG. 4 shows a schematic cross-sectional view of one of the holes HO of an embodiment.

The light emitting layer (see EML of FIG. 1) of the display panel may be deposited according to a pattern. The deposition vapor DM may pass through the holes HO of the mask MK, and may be deposited in the opening PDL-OP of the pixel definition layer PDL, with the result that the light emitting layer may be formed. The light emitting layer (see EML of FIG. 1) formed through one of the holes HO may correspond to a pixel included in the display panel (see DP of FIG. 1).

The holes HO may have a planar area which decreases as from the conductive layer CL to the polymer film PF adjacent to the target substrate SUB. The deposition vapor DM may pass through inclined surfaces forming the holes HO and may be deposited on the target substrate SUB and thus the light emitting layer formed by deposition of the deposition vapor DM may have a thickness which is uniform as a whole.

Figure 5B:
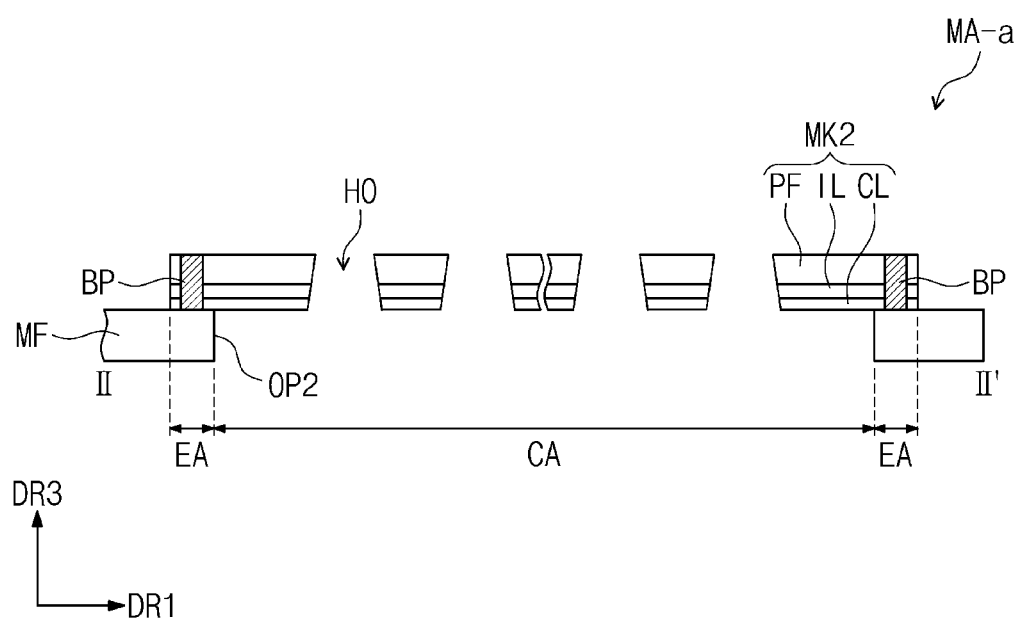
FIG. 5B illustrates a schematic cross-sectional view showing a mask assembly taken along line II-II' of FIG. 5A.

FIG. 5A illustrates a perspective view showing a mask assembly according to an embodiment. FIG. 5B illustrates a schematic cross-sectional view of a mask assembly MA-a taken along line II-II' which corresponds to a mask MK2 among multiple masks shown in FIG. 5A. The mask assembly MA-a illustrated in FIGS. 5A and 5B may include components substantially the same as those of the mask assembly MA according to an embodiment shown in FIG. 3A, and there is a difference in the number of the masks included in one mask assembly. FIG. 5A shows reference numerals on some of the masks MK1, MK2, and MK3. The description above may be identically applicable to that of the mask MK1, MK2, or MK3 and the mask frame MF shown in FIGS. 5A and 5B.

The mask frame MF may have a tetragonal shape with four sides, each of which extends in the first direction DR1 or the second direction DR2. At least one opening may be defined in one mask frame MF. In embodiments, the at least one opening may include multiple openings. The openings may be arranged to be spaced apart from each other. The openings may be arranged along one or both of the first and second directions DR1 and DR2. As shown in FIG. 5A, the openings may be arranged along the first and second directions DR1 and DR2 to have a matrix arrangement.

Each of the openings may be a hole which penetrates from a top surface to a bottom surface of the mask frame MF. The openings may correspondingly overlap the at least one cell regions CA of masks MK1, MK2, and MK3 and may correspondingly expose bottom surfaces of the masks MK1, MK2, and MK3.

Each of the openings may have a tetragonal shape when viewed in a plan view. An embodiment, however, is not limited thereto, and the openings may have their shapes which are changed depending on shapes of the masks MK1, MK2, and MK3 which are disposed correspondingly to the openings.

FIG. 5A shows the mask frame MF in which nine openings are defined. However, embodiments are not limited thereto, and the number of the openings in the mask frame MF may be changed depending on a size of the target substrate which will be deposited.

A single mask assembly MA-a may include masks MK1, MK2, and MK3. The masks MK1, MK2, and MK3 may be disposed on the mask frame MF, respectively, corresponding to the openings of the mask frame MF. For convenience of description, in FIG. 5A, one mask MK1 is shown as if spaced apart from the mask frame MF and is shown to correspond one opening OP1 among the openings. Another mask MK2 corresponds to another opening (see OP2 of FIG. 5B) among the openings.

When viewed in a plan view, each of the masks MK1, MK2, and MK3 may have at least one cell region CA and at least one peripheral region EA which surrounds the at least one cell region CA. The at least one cell regions CA defined in each of the masks MK1, MK2, and MK3 may correspondingly overlap the openings of the mask frame MF. Each of the masks MK1, MK2, and MK3 may include, in its at least one cell region CA, holes HO which penetrate the mask MK1, MK2, or MK3 and are spaced part from each other.

Each of the masks MK1, MK2, and MK3 may have a tetragonal shape when viewed in a plan view. However, no limitation is imposed on the shape of the mask MK1, MK2, or MK3.

The masks MK1, MK2, and MK3 included in the mask assembly MA-a may have a same area, or in another embodiment, at least one of the masks may have an area different from those of other marks. The openings of the mask frame MF may have their areas which are changed depending on the areas of the masks MK1, MK2, and MK3. The areas of the masks MK1, MK2, and MK3 and the openings of the mask frame MF may be changed based on that of a deposition target.

The masks MK1, MK2, and MK3 may be arranged in one or both of the first and second directions DR1 and DR2 to correspond to the openings of the mask frame MF. FIG. 5A shows nine masks MK1, MK2, and MK3 which are disposed correspondingly to nine openings. However, embodiments are not limited thereto, and the number of the masks MK1, MK2, and MK3 may be changed depending on the size of the target substrate which will be deposited and on the number of the openings defined in the mask frame MF.

Referring to FIGS. 5A and 5B, each of the masks MK1, MK2, and MK3 may be bonded to the mask frame MF. Each of the masks MK1, MK2, and MK3 may include a bonding part BP at its portion which is bonded to the mask frame MF. The bonding part BP may be disposed in the peripheral region EA overlapping the mask frame MF, when viewed in a plan view. The mask MK and the mask frame MF shown in FIG. 3A may also be bonded to each other and a portion of the mask MK being bonded to the mask frame MF may overlap the peripheral region EA when viewed in a plan view.

Referring to FIG. 5B, the bonding part BP may be a portion through which the mask MK2 and the mask frame MF are welded to each other. For example, the bonding part BP may be formed when a welding stick disposed on the mask MK2 is melted to combine with a partially melted portion of the mask frame MF. The bonding part BP may include metal oxide. A bonding method between the mask MK and the mask frame MF will be further discussed in detail below.

The bonding part BP may extend along the first direction DR1 or the second direction DR2 in the peripheral region EA of the mask MK2 and may bond the mask frame MF to the mask MK2. An embodiment, however, is not limited thereto, and the bonding part BP may extend in the first and second directions DR1 and DR2 along the peripheral region EA which surrounds the cell region CA of the mask MK2, and the bonding part BP may have a tetragonal ring shape when viewed in a plan view.

The following will discuss a mask fabrication method according to an embodiment. The same reference symbols are allocated to components the same as those discussed above, and detailed description thereof will be omitted in explaining a mask fabrication method according to an embodiment.

Figure 6:
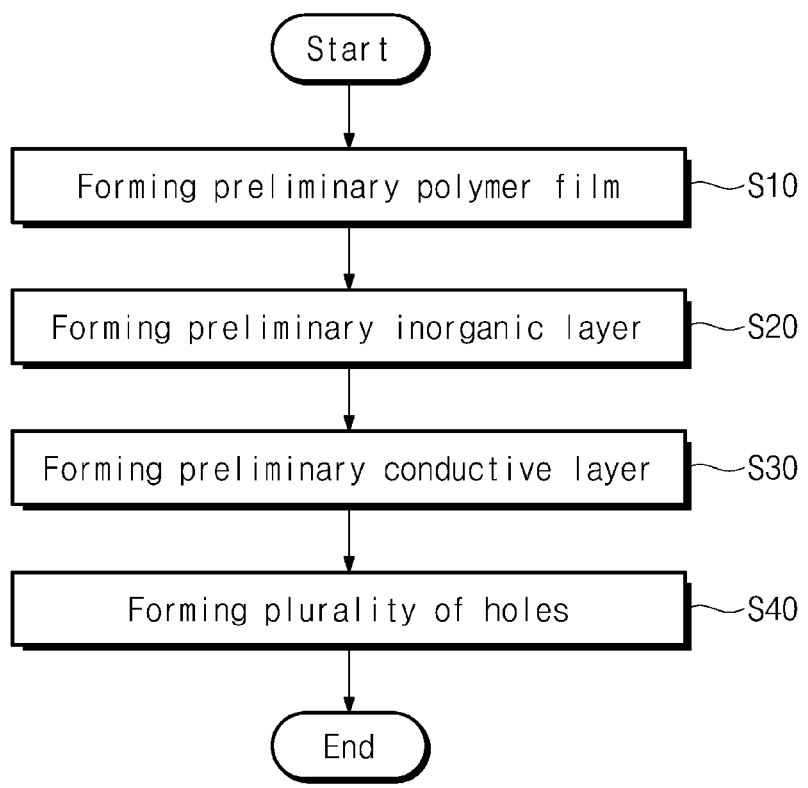
FIG. 6 illustrates a flow chart showing a mask fabrication method according to an embodiment.

FIG. 6 illustrates a flow chart showing a mask fabrication method according to an embodiment. Referring to FIG. 6, a mask fabrication method may include a step S10 of forming a preliminary polymer film, a step S20 of forming a preliminary inorganic layer on the preliminary polymer film, a step S30 of forming a preliminary conductive layer on the preliminary inorganic layer, and a step S40 of forming holes which penetrate the preliminary polymer film, the preliminary inorganic layer, and the preliminary conductive layer. In this description, the language "preliminary" may mean a state before the holes are formed in components included in the mask MK.

FIGS. 7A to 7D illustrate schematic cross-sectional views showing a mask fabrication method according to an embodiment. FIG. 8A to 8E illustrate schematic cross-sectional views showing a mask fabrication method according to an embodiment. FIGS. 9A and 9B illustrate schematic cross-sectional views showing a mask fabrication method according to an embodiment.

Figure 7A:
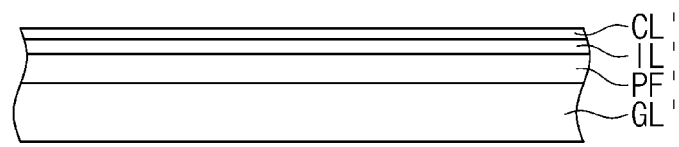
FIGS. 7A to 7D illustrate schematic cross-sectional views showing a mask fabrication method according to an embodiment.
Figure 7A:

FIG. 7A illustrates a schematic cross-sectional view showing a step of sequentially stacking a preliminary polymer film PF', a preliminary inorganic layer IL', and a preliminary conductive layer CL'. The preliminary polymer film PF' may be formed by coating a polymer resin on a glass layer GL'. The preliminary polymer film PF' may be formed to have a plate shape on the glass layer GL'. The polymer resin may include at least one of polyimide, polycarbonate, polyethylene naphthalene, and polyethylene terephthalate.

The preliminary inorganic layer IL' may be formed or deposited on the preliminary polymer film PF'. The preliminary inorganic layer IL' may be formed to cover a surface of the preliminary polymer film PF'. The preliminary inorganic layer IL' may be formed by a deposition process, such as chemical vapor deposition (CVD), which forms a deposition material including a silicon-based inorganic material. For example, the silicon-based inorganic material may include at least one of silicon oxide and silicon nitride.

The preliminary conductive layer CL' may be formed or deposited on the preliminary inorganic layer IL'. The preliminary conductive layer CL' may be formed to cover a surface of the preliminary inorganic layer IL'. The preliminary conductive layer CL' may be formed of a metal-containing deposition material by a deposition process, such as sputtering, chemical vapor deposition (CVD), or plasma enhanced chemical vapor deposition (PECVD). For example, the metal may include at least one of nickel (Ni), gold (Au), titanium (Ti), molybdenum (Mo), titanium nitride (TiN$_x$), indium tin oxide (ITO), and indium zinc oxide (IZO).

A mask (see MK of FIG. 7C) may be fabricated by forming holes HO which penetrate the preliminary polymer film PF', the preliminary inorganic layer IL', and the preliminary conductive layer CL' which are sequentially stacked. The holes HO may be formed by laser irradiation or etching.

Figure 7B:
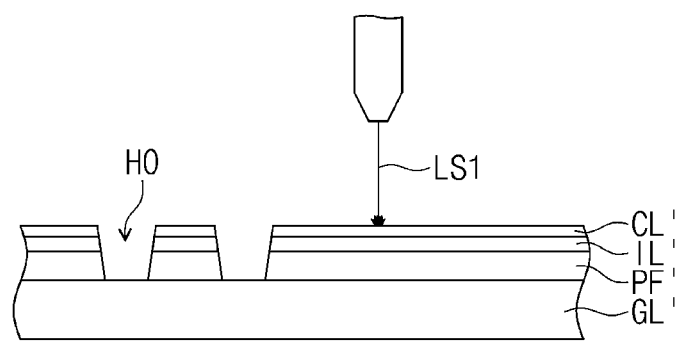
Figure 7B:
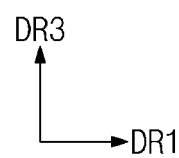

FIG. 7B illustrates a schematic cross-sectional view showing a step in which a laser LS1 is irradiated to form the holes HO. The hole HO may be formed with the laser LS1 irradiated to a location on which the hole HO will be needed in a state in which the preliminary polymer film PF', the preliminary inorganic layer IL', and the preliminary conductive layer CL' are sequentially stacked. The laser LS1 may simultaneously penetrate the preliminary polymer film PF', the preliminary inorganic layer IL', and the preliminary conductive layer CL'.

Compared to a procedure where a laser is used to process an alloy, a procedure where the laser LS1 is used to process the preliminary polymer film PF' to form the holes HO may have a reduced work time and a reduced amount of dust produced during the processing. Through this, the hole-processing surface may be reduced or prevented from adsorption of dust produced during the processing. Therefore, the mask fabrication method of an embodiment may have an effect to provide a mask for which fabrication time is decreased and for which reliability is increased.

A wavelength range of the laser LS1 may include a wavelength range of ultraviolet light. For example, the laser LS1 may have a wavelength equal to or less than about 400 nm. The wavelength range of ultraviolet light, however, is not limited to the example above. When the laser LS1 has a too short of a wavelength or too strong of an intensity, there may be damage to stacking structures to which the laser LS1 is irradiated. When the laser LS1 has a too long of a wavelength or too weak of an intensity, there may be difficulty in forming the holes HO which completely penetrate through the stacking structures.

The holes HO may be formed to have a regular arrangement when viewed in a plan view. For example, the holes HO may be formed to have a pattern in a plan view. The holes HO may be arranged along the first direction DR1 and the second direction DR2, and FIG. 7B shows by way of example a schematic cross-sectional view showing a step of forming the holes HO which are arranged along the first direction DR1.

The holes HO may be formed by irradiation of a single laser LS1. An embodiment, however, is not limited thereto, multiple lasers may be simultaneously irradiated to form holes HO at the same time.

Figure 7C:
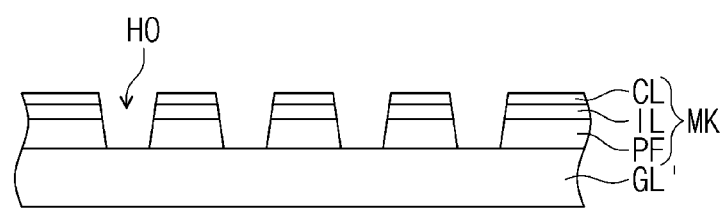
Figure 7C:
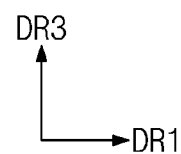

FIG. 7C shows a cross-section of the mask MK formed on the glass layer GL'. The holes HO may be arranged at a certain interval along the first direction DR1 and the second direction DR2, and a pattern formed by the holes HO may correspond to a pattern of a deposition layer which will be deposited by using the mask MK.

Figure 7D:
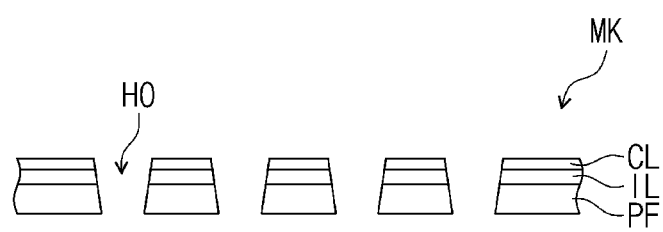
Figure 7D:
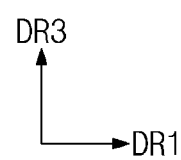

FIG. 7D shows a cross-section of the mask MK eventually formed by separating the glass layer GL' and the mask MK from each other. The mask MK may be fabricated in which the polymer film PF, the inorganic layer IL, and the conductive layer CL are sequentially stacked and in which the holes HO penetrate the polymer film PF, the inorganic layer IL, and the conductive layer CL. The fabricated mask MK may undergo ultrasonic cleaning to remove contamination produced in the fabrication method. The inorganic layer IL disposed between the polymer film PF and the conductive layer CL may prevent the conductive layer CL from being delaminated due to the ultrasonic cleaning.

FIGS. 8A to 8E illustrate schematic cross-sectional views of a mask fabrication method according to an embodiment, showing steps in which etching processes are used to form holes. The same reference symbols are allocated to components the same as those discussed above, and detailed description thereof will be omitted in explaining a mask fabrication method according to an embodiment with reference to FIGS. 8A to 8E.

Referring to FIGS. 8A to 8E, the holes HO may be formed by etching processes which correspondingly etch the preliminary conductive layer CL', the preliminary inorganic layer IL', and the preliminary polymer film PF'. In an embodiment, the step S40 of forming the holes HO may include a first etching step, a second etching step, and a third etching step.

Figure 8A:
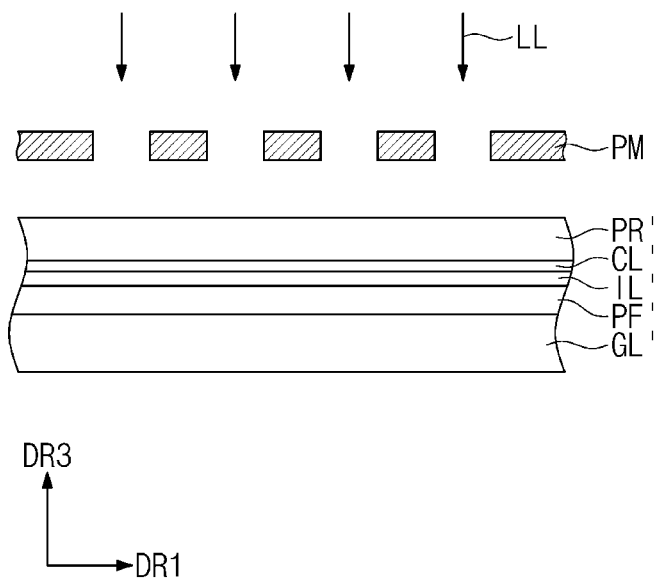
FIGS. 8A to 8E illustrate schematic cross-sectional views showing a mask fabrication method according to an embodiment.
Figure 9A:
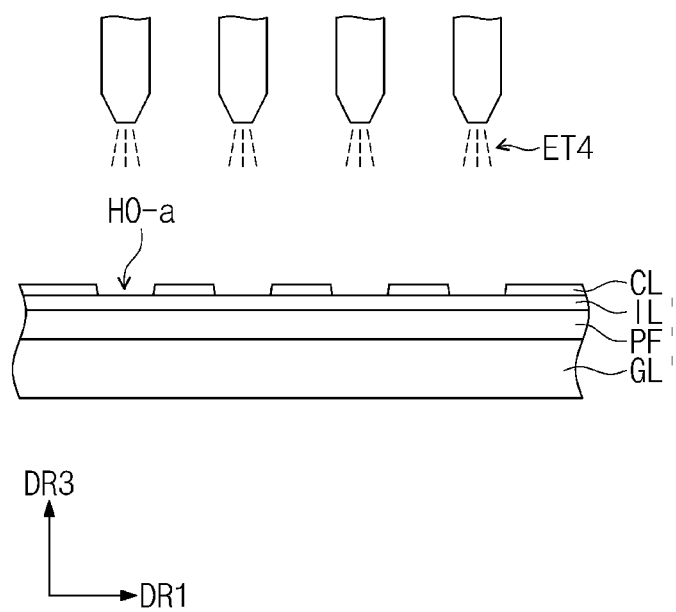
FIGS. 9A and 9B illustrate schematic cross-sectional views showing a mask fabrication method according to an embodiment.
Figure 9B:
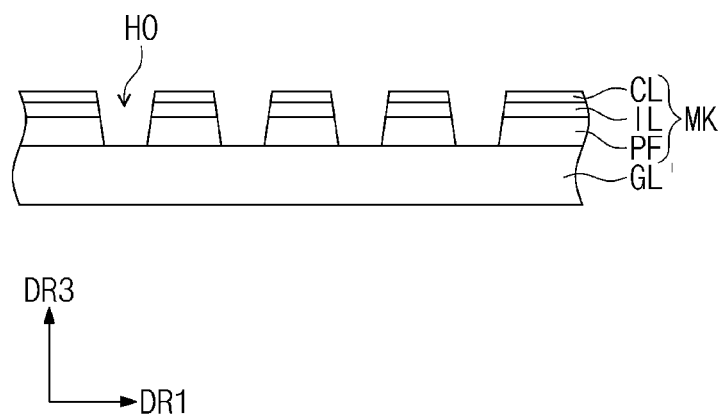

Referring to FIG. 8A, a pre-patterned photoresist PR' may be disposed on the preliminary conductive layer CL' in a state where the preliminary conductive layer CL', the preliminary inorganic layer IL', and the preliminary polymer film PF' are sequentially stacked as shown in FIG. 7A. The photoresist PR' may include a photosensitive material.

A pattern mask PM may be disposed on the photoresist PR' so as to pattern the photoresist PR'. The pattern mask PM may be irradiated with light LL to pattern the photoresist PR' to correspond to a pattern of the pattern mask PM. A patterned photoresist PR may serve as an etching mask in a step of etching the preliminary conductive layer CL'.

Figure 8B:
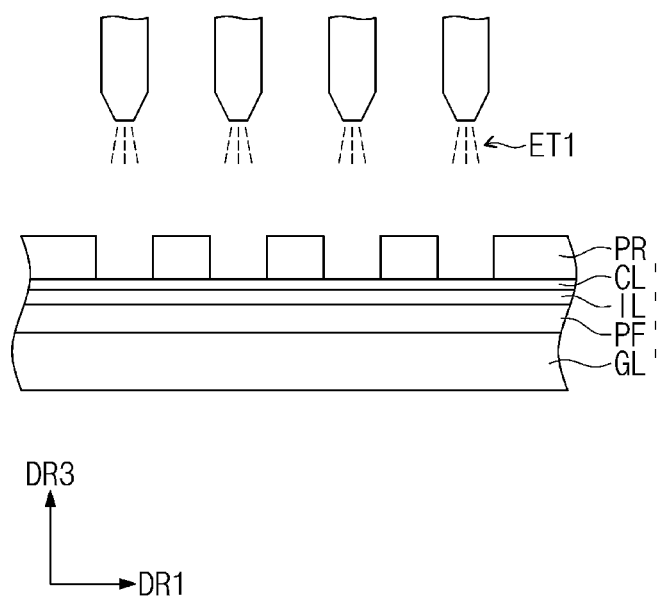

Referring to FIG. 8B, the patterned photoresist PR may be provided with an etchant ET1 coated thereon to form first preliminary holes HO-a which penetrate the preliminary conductive layer CL'. The first etching step in which the preliminary conductive layer CL' is etched may be a wet etching step which uses the etchant ET1, but embodiments are not limited thereto, and the first etching step may be a dry etching step which uses a plasma gas.

The preliminary conductive layer CL' may be patterned to correspond to a pattern of the patterned photoresist PR. The patterned photoresist PR may partially expose the preliminary conductive layer CL', and the etchant ET1 may etch the exposed portion of the preliminary conductive layer CL'. The etching process on the preliminary conductive layer CL' may form the first preliminary holes HO-a which penetrate the preliminary conductive layer CL'.

Figure 8C:
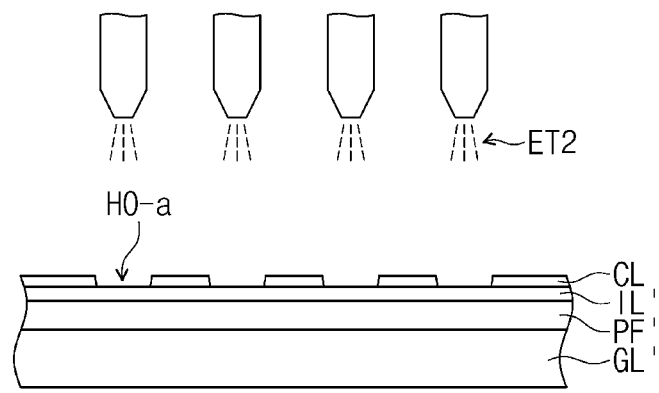
Figure 8C:
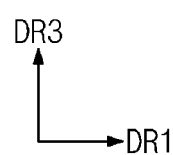

Referring to FIG. 8C, after the formation of the conductive layer CL in which the first preliminary holes HO-a are formed, the patterned photoresist PR may be removed. The conductive layer CL, in which the first preliminary holes HO-a are formed, may serve as an etching mask in a step of etching the preliminary inorganic layer IL' and the preliminary polymer film PF'.

The conductive layer CL in which the first preliminary holes HO-a are formed may be provided with a first plasma gas ET2 sprayed thereon to form second preliminary holes HO-b which penetrate the preliminary inorganic layer IL'. The second etching step in which the preliminary inorganic layer IL' is etched may be a dry etching step which uses the first plasma gas ET2.

The preliminary inorganic layer IL' may be patterned to correspond to a pattern of the conductive layer CL in which the first preliminary holes HO-a are formed. The conductive layer CL in which the first preliminary holes HO-a are formed may partially expose a top surface of the preliminary inorganic layer IL', and the first plasma gas ET2 may etch the exposed portion of the preliminary inorganic layer IL'. The etching process on the preliminary inorganic layer IL' may form the second preliminary holes HO-b which overlap the first preliminary holes HO-a. Therefore, the second preliminary holes HO-b may be formed to penetrate the conductive layer CL and the inorganic layer IL.

Figure 8D:
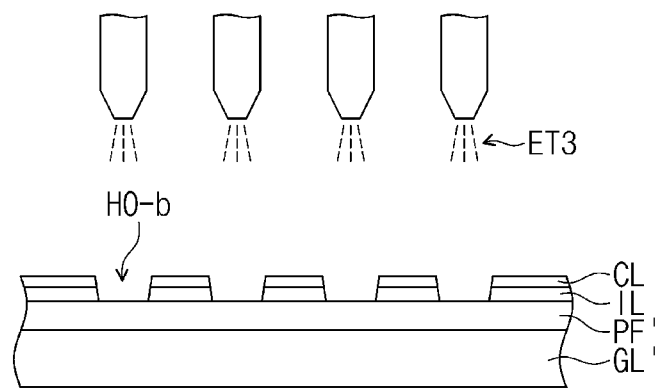
Figure 8D:
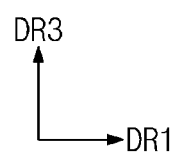

Referring to FIG. 8D, the conductive layer CL and the inorganic layer IL in which the second preliminary holes HO-b are formed may serve as an etching mask in a step of etching the preliminary polymer film PF'. The conductive layer CL may be provided with a second plasma gas ET3 sprayed thereon to form holes HO which penetrate the preliminary polymer film PF'. The holes HO may be formed to overlap the first and second preliminary holes HO-a and HO-b, and may correspond to the holes HO defined in the mask MK which penetrate the polymer film PF, the inorganic layer IL, and the conductive layer CL which are discussed above.

The third etching step in which the preliminary polymer film PF' is etched may be a dry etching step which uses the second plasma gas ET3. The second plasma gas ET3 to etch the preliminary polymer film PF' may be different from the first plasma gas ET2 to etch the preliminary inorganic layer IL'.

The conductive layer CL and the inorganic layer IL may partially expose a top surface of the preliminary polymer film PF', and the second plasma gas ET3 may etch the exposed portion of the preliminary polymer film PF'. The etching process on the preliminary polymer film PF' may form the holes HO which correspond to a pattern of the conductive layer CL and the inorganic layer IL in which the second preliminary holes HO-b are formed.

Figure 8E:
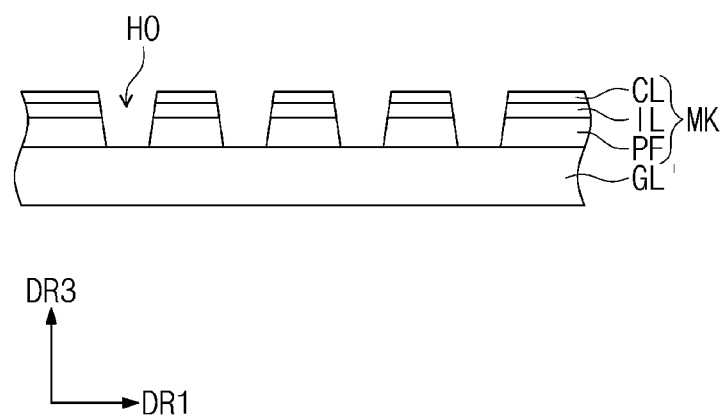

FIG. 8E shows a schematic cross-sectional view of the mask MK in which the holes are formed by the etching steps. The holes HO may be arranged at certain intervals along the first direction DR1 and the second direction DR2 to thereby correspond to a pattern of the patterned photoresist PR. After the holes HO are formed by the etching process, the glass layer GL' may be removed to eventually fabricate the mask MK as shown in FIG. 7D.

FIGS. 9A and 9B illustrate schematic cross-sectional views showing steps in which etching processes are used to form holes. Referring to FIGS. 9A and 9B, the holes HO may be formed by a first etching step in which the preliminary conductive layer CL' is etched and a fourth etching step in which the preliminary inorganic layer IL' and the preliminary polymer film PF' are etched simultaneously.

Those discussed with reference to FIGS. 8A and 8B may be identically applicable to the first etching step in which the preliminary conductive layer CL'. After the formation of the conductive layer CL, the patterned photoresist PR may be removed. Referring to FIG. 9A, the conductive layer CL, in which the first preliminary holes HO-a are formed, may serve as an etching mask in the fourth etching step which etches the preliminary inorganic layer IL' and the preliminary polymer film PF'.

The conductive layer CL in which the first preliminary holes HO-a are formed may be provided with a third plasma gas ET4 sprayed thereon to form holes HO which penetrate the preliminary inorganic layer IL' and the preliminary polymer film PF'. The holes HO may be formed to overlap the first preliminary holes HO-a, and may correspond to the holes HO defined in the mask MK which penetrate the polymer film PF, the inorganic layer IL, and the conductive layer CL which are discussed above.

The fourth etching step in which the preliminary inorganic layer IL' and the preliminary polymer film PF' are etched may be a dry etching step which uses the third plasma gas ET4. The preliminary inorganic layer IL' and the preliminary polymer film PF' may be simultaneously etched with the same third plasma gas ET4.

The preliminary inorganic layer IL' and the preliminary polymer film PF' may be patterned to correspond to a pattern of the conductive layer CL in which the first preliminary holes HO-a are formed. The conductive layer CL in which the first preliminary holes HO-a are formed may partially expose a top surface of the preliminary inorganic layer IL', and the third plasma gas ET4 may etch the exposed portion of the preliminary inorganic layer IL' and the preliminary polymer film PF' disposed thereunder. Holes HO which overlap the first preliminary holes HO-a may be formed by the process in which the preliminary inorganic layer IL' and the preliminary polymer film PF' are etched at the same time.

Whether and how much a material is etched may depend on kind, exposure time, density, and temperature of plasma gas. As shown in FIGS. 8C and 8D, the preliminary inorganic layer IL' and the preliminary polymer film PF' may be correspondingly precisely etched by using plasma gases different from each other. However, embodiments are not limited thereto, and as shown in FIG. 9A, the same plasma gas may be used to simultaneously etch the preliminary inorganic layer IL' and the preliminary polymer film PF'. The simultaneous etching process may reduce fabrication costs and may reduce process steps.

FIG. 9B shows a schematic cross-sectional view of the mask MK in which the holes HO are formed by the etching process performed on the preliminary conductive layer CL' and the simultaneous etching process performed at the same time on the preliminary inorganic layer IL' and the preliminary polymer film PF'. The holes HO may be arranged at a certain interval along the first direction DR1 and the second direction DR2 to thereby correspond to a pattern of the patterned photoresist PR. After the holes HO are formed by the etching process, the glass layer GL' may be removed to eventually fabricate the mask MK as shown in FIG. 7D.

Figure 10A:
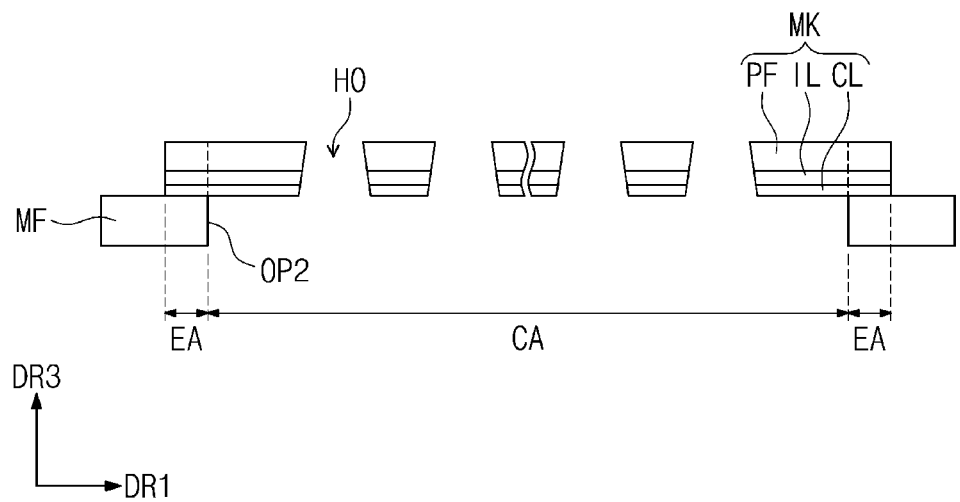
FIGS. 10A to 10C illustrate schematic cross-sectional views showing a mask assembly fabrication method according to an embodiment.
Figure 10B:
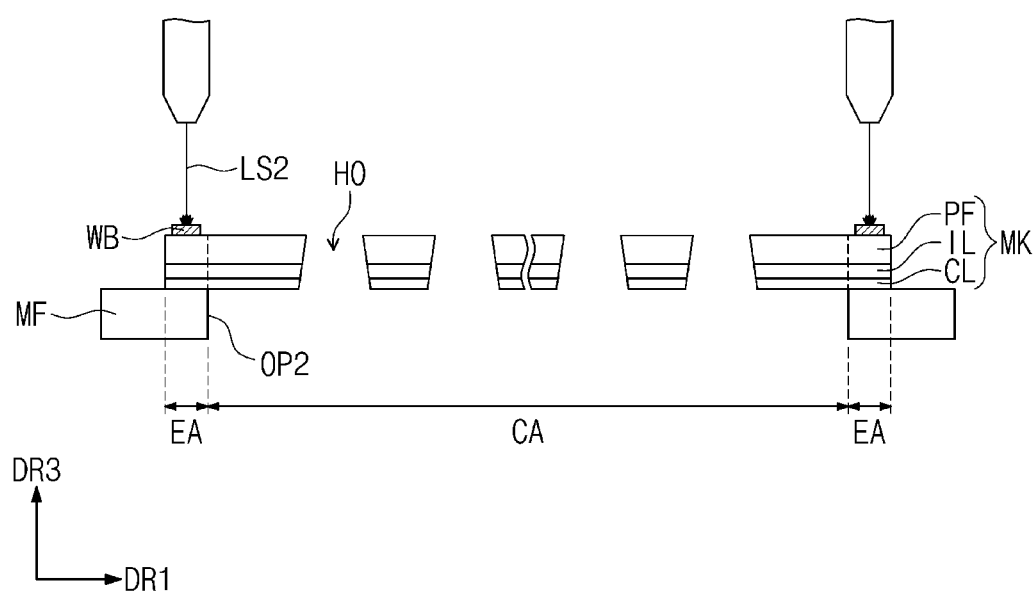
Figure 10C:
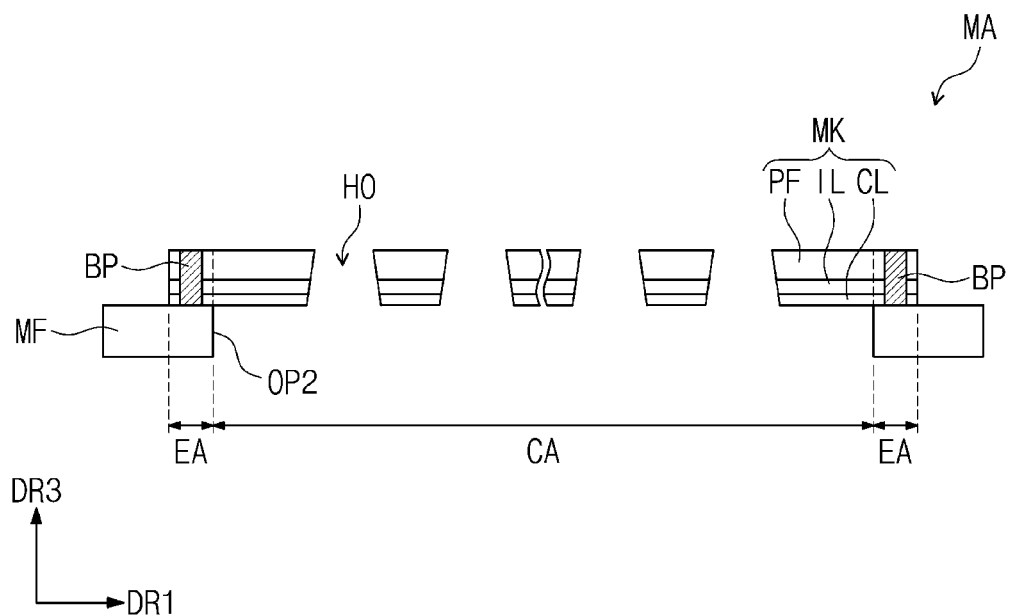

FIGS. 10A to 10C illustrate schematic cross-sectional views showing a mask assembly fabrication method according to an embodiment. The same reference symbols are allocated to components the same as those discussed above, and detailed description thereof will be omitted in explaining a mask assembly fabrication method of an embodiment with reference to FIGS. 10A to 10C. For convenience of description, FIGS. 10A to 10C show dotted lines which indicate the peripheral region EA of the mask MK, which peripheral region EA overlaps the mask frame MF when viewed in a plan view.

The mask assembly MA of an embodiment may be formed by bonding the mask MK to the mask frame MF. Referring to FIG. 10A, the mask MK which is fabricated may be disposed to allow its conductive layer CL to rest on a top surface of the mask frame MF. The mask MK may be disposed on the mask frame MF to allow the holes HO defined in the mask MK to overlap the opening OP of the mask frame MF.

Although not shown, the mask MK may be tensioned before the mask MK is disposed on the mask frame MF. A damper included in a tension apparatus may provide the mask MK with tension in one or both of the first direction DR1 and the second direction DR2 which depart from a center of the mask MK.

Referring to FIG. 10B, a welding stick WB may be disposed on the peripheral region EA of the mask MK which overlaps the mask frame MF. The welding stick WB may have a bar shape which extends in one direction. For example, the welding stick WB may be disposed to surround the cell region CA of the mask MK and to overlap the peripheral region EA of the mask MK. However, embodiments are not limited thereto.

The welding stick WB may include a metal. For example, the welding stick WB may include a stainless steel (SUS), an Invar alloy, nickel (Ni), or cobalt (Co).

The welding stick WB may be irradiated and melted with a laser LS2. The mask frame MF may have a partially melted portion at its top surface in contact with the mask MK, and the melted welding stick WB may be bonded to the partially melted portion of the mask frame MF. The melted welding stick WB may bond the mask MK and the mask frame MF to each other.

Referring to FIG. 10C, the welding stick WB melted in the welding process may penetrate the polymer film PF, the inorganic layer IL, and the conductive layer CL of the mask MK, and may be in contact with and bonded to the partially melted portion of the mask frame MF to thereby form a bonding part BP through which the mask MK is bonded to the mask frame MF. The bonding part BP may include a metal oxide. The description discussed with reference to FIG. 5B may be identically applicable to the bonding part BP.

As a mask according to an embodiment includes a polymer film, the mask may be easily formed to have a small weight and a large size and may be suitable for depositing a large-area target substrate. As the mask of an embodiment includes a conductive layer, the mask may be prevented from sagging. As the mask of an embodiment includes an inorganic layer which attaches the polymer film to the conductive layer, the conductive layer may be prevented from being delaminated due to a repetitive cleaning process. Therefore, the mask of an embodiment and a mask assembly including the same may increase in lifespan and reliability. A mask fabrication method according to an embodiment may provide a mask lifespan and reliability are increased without installing additional facilities.

When cleaning the mask used in a deposition process for fabrication of display panels, it may be possible to avoid delamination between components of the mask.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A mask comprising:
    a polymer film in which at least one cell region and at least one peripheral region are defined, the at least one peripheral region surrounding the at least one cell region;
    a conductive layer disposed on the polymer film, the conductive layer including a metal; and
    an inorganic layer disposed between the polymer film and the conductive layer, the inorganic layer including a silicon-based inorganic material; and
    a plurality of holes that penetrate the polymer film, the conductive layer, and the inorganic layer, and overlap the at least one cell region in a plan view, wherein
    there is a one-to-one correspondence between ones of the holes in each of the polymer film, the conductive layer and the inorganic layer.

2. The mask of claim 1, wherein the inorganic layer includes at least one of silicon oxide ($SiO_x$) and silicon nitride ($SiN_x$).

3. The mask of claim 1, wherein the polymer film includes at least one of polyimide (PI), polycarbonate (PC), polyethylene naphthalene (PEN), and polyethylene terephthalate (PET).

4. The mask of claim 1, wherein the conductive layer includes at least one of nickel (Ni), gold (Au), titanium (Ti), molybdenum (Mo), titanium nitride ($TiN_x$), indium tin oxide (ITO), and indium zinc oxide (IZO).

5. The mask of claim 1, wherein a thickness of the polymer film is in a range of about 3 μm to about 50 μm.

6. The mask of claim 1, wherein a thickness of the inorganic layer is less than a thickness of the polymer film.

7. The mask of claim 1, wherein
    the at least one cell region includes a plurality of cell regions,
    the plurality of cell regions are spaced apart from each other, and
    the at least one peripheral region is disposed between adjacent ones of the plurality of cell regions.

8. The mask of claim 1, wherein each of the plurality of holes are defined to correspond to a shape of a light emitting layer of a display panel.

9. The mask of claim 1, wherein
    each of the polymer film, the conductive layer and the inorganic layer include a same number of holes, and
    each of the holes in each of the polymer film, the conductive layer and the inorganic layer are concentric.

10. A mask assembly, comprising: a mask frame in which at least one opening is defined; and at least one mask disposed on the mask frame corresponding to the at least one opening of the mask frame, wherein the at least one mask includes: a polymer film in which at least one cell region and at least one peripheral region are defined, the at least one peripheral region surrounding the cell region; a conductive layer disposed on the polymer film, the conductive layer including a metal; and an inorganic layer disposed between the polymer film and the conductive layer, the inorganic layer including a silicon-based inorganic material; and a plurality of holes that penetrate the polymer film, the conductive layer, and the inorganic layer, and overlap the at least one cell region in a plan view and wherein a number of holes in each of the polymer film, the conductive layer and the inorganic layer are the same, and there is a one-to-one correspondence between a number of holes in each of the polymer film, the conductive layer and the inorganic layer.

11. The mask assembly of claim 10, wherein the inorganic layer includes at least one of silicon oxide ($SiO_x$) and silicon nitride ($SiN_x$).

12. The mask assembly of claim 10, wherein the at least one cell region includes a plurality of cell regions,
    the plurality of cell regions are spaced apart from each other,
    the at least one peripheral region is disposed between adjacent ones of the plurality of cell regions, and
    the plurality of cell regions overlap the at least one opening in a plan view.

13. The mask assembly of claim 10, wherein
    the at least one opening includes a plurality of openings,
    the at least one mask includes a plurality of masks, and
    the plurality of masks are disposed on the mask frame corresponding to the plurality of openings.

14. The mask assembly of claim 10, wherein
    a portion of the at least one mask is bonded to the mask frame to overlap the at least one peripheral region in a plan view, and
    the portion of the at least one mask bonded to the mask frame includes a metal oxide.

15. The mask assembly of claim 10, wherein each of the polymer film, the conductive layer and the inorganic layer are arranged within the at least one opening.

* * * * *